United States Patent
Henson

(10) Patent No.: US 6,979,862 B2
(45) Date of Patent: Dec. 27, 2005

(54) TRENCH MOSFET SUPERJUNCTION STRUCTURE AND METHOD TO MANUFACTURE

(75) Inventor: Timothy Henson, Redondo Beach, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 10/761,484

(22) Filed: Jan. 20, 2004

(65) Prior Publication Data

US 2004/0150039 A1 Aug. 5, 2004

Related U.S. Application Data

(60) Provisional application No. 60/442,722, filed on Jan. 23, 2003.

(51) Int. Cl.[7] ........................... H01L 21/336
(52) U.S. Cl. .................. 257/330; 257/328; 257/329; 257/331; 438/259; 438/587
(58) Field of Search ................ 257/330, 301, 257/322, 332, 213, 214, 215, 328, 329, 331; 438/259, 587

(56) References Cited

U.S. PATENT DOCUMENTS

| | | | |
|---|---|---|---|
| 4,754,310 A | 6/1988 | Coe | ............................ 357/13 |
| 5,216,275 A | 6/1993 | Chen | ........................... 257/493 |
| 6,084,264 A | 7/2000 | Darwish | ..................... 257/329 |
| 6,291,856 B1 | 9/2001 | Miyasaka et al. | ........... 257/335 |
| 6,376,878 B1 | 4/2002 | Kocon | ......................... 257/328 |
| 6,495,421 B2 * | 12/2002 | Luo | ............................ 438/269 |
| 6,541,817 B1 * | 4/2003 | Hurkx et al. | ............... 257/330 |
| 6,667,514 B2 * | 12/2003 | Ahlers et al. | .............. 257/336 |
| 6,756,273 B2 * | 6/2004 | Hadizad et al. | ............. 438/269 |
| 2001/0015457 A1 * | 8/2001 | Boden, Jr. | .................. 257/330 |
| 2003/0006454 A1 | 1/2003 | Darwish | ..................... 257/329 |
| 2003/0102564 A1 * | 6/2003 | Darwish | ..................... 257/769 |

* cited by examiner

Primary Examiner—Nathan J. Flynn
Assistant Examiner—Fazli Erdem
(74) Attorney, Agent, or Firm—Ostrolenk, Faber, Gerb & Soffen, LLP

(57) ABSTRACT

A power semiconductor device including a plurality of trenches each for supporting a gate structure adjacent a channel region, and a plurality of drain columns each under the bottom of each trench, and each formed by multiple high energy implants.

16 Claims, 4 Drawing Sheets

US 6,979,862 B2

TRENCH MOSFET SUPERJUNCTION STRUCTURE AND METHOD TO MANUFACTURE

CROSS-REFERENCE TO RELATED APPLICATION

The present application is based on and claims benefit of U.S. Provisional Application Ser. No. 60/442,722, filed Jan. 23, 2003, entitled TRENCH MOSFET SUPERJUNCTION STRUCTURE AND METHOD TO MANUFACTURE, to which a claim of priority is made.

FIELD OF THE INVENTION

The present invention relates to a semiconductor device and more particularly to a trench type power semiconductor device.

BACKGROUND OF THE INVENTION

A well known and prevalently used power semiconductor device is a power MOSFET. FIG. 1 shows a cross-sectional view of a portion of the active region of a power MOSFET according to prior art. The device illustrated by FIG. 1 is of the trench variety. A trench type power MOSFET includes vertical gate structures.

FIG. 2 shows the cross-sectional view of a portion of the active region of a prior art power MOSFET. The device illustrated by FIG. 2 is a planar type device. Such devices include horizontally oriented gate structures.

Referring now to both FIGS. 1 and 2, each device includes source regions 10 each formed in a channel region 12. Gate structures are formed adjacent source regions 10 and the channel region 12 in which the source regions 10 are formed. Each gate structure includes a gate electrode 14, which is typically formed from a conductive polysilicon, and a gate insulation layer 16 which is typically comprised of silicon dioxide. Each gate insulation layer 16 insulates its associated gate electrode 14 from an adjacent channel region 12.

As is well known in the art, in a vertical conduction type MOSFET, channel region 12 is disposed adjacent to drain region 18. Drain region 18 and source regions 10 are of one conductivity while channel region 12 is of the opposite conductivity. Thus, under a range of applied voltages, source regions 10 and drain region 18 are insulated from one another by channel region 12. When an appropriate voltage is applied to a gate electrode 14 a region (invertible channel region or channel) in channel region 12 adjacent its associated gate insulation layer 16 changes conductivity through what is referred to as inversion. As a result, source regions 10 and drain region 18 become electrically connected. Thus, current can be conducted when a voltage is applied between source regions 10 and drain region 18.

In a typical power MOSFET, drain region 18 is epitaxially formed over a semiconductor substrate 20 of the same conductivity, but of a higher concentration of dopants. To allow for external electrical connection drain contact 22 may be electrically connected to substrate 20, and source contact 24 may be electrically connected to source regions 10. It is also well known to connect source contact 24 to a high conductivity contact region 26 of the same conductivity as channel region 12 in order to suppress the possibility of formation of parasitic devices.

FIGS. 1 and 2 show an N channel device in which source regions 10 and drain region 18 have N type conductivity, while channel region 12 has P type conductivity. These conductivity types may be reversed in order to obtain a P channel device.

In a power MOSFET, it is desirable to reduce the resistance of the device during conduction (Rdson). Rdson is primarily determined by the resistance of the channel and the resistance of drain region 18 (sometimes referred to as drift region). The resistivity of the drift region is determined by the resistivity and thickness of the epitaxial layer, and is proportional to the breakdown voltage rating of the device. The breakdown voltage rating of the device indicates the ability of the device to withstand breakdown under reverse voltage conditions. Thus, to reduce Rdson the conductivity of the epitaxial layer can be increased, which adversely affects the breakdown voltage rating of the device. Conversely, to improve the breakdown voltage rating the conductivity of the epitaxial layer can be reduced, which increases Rdson. The inverse relationship between Rdson and breakdown voltage rating often forces designers to settle for less than ideal values for the Rdson and the breakdown voltage rating of a device.

A superjunction structure allows the designers to decrease the Rdson of a device without adversely affecting its breakdown voltage. A superjunction device includes alternating P and N type regions below the active cells of the device. The alternating P and N type regions are in substantial charge balance so that under a reverse voltage condition these regions deplete one another thereby allowing the device to withstand breakdown. Thus, a superjunction arrangement allows for an increase in the conductivity of the drain region to improve the Rdson without an effect on the breakdown voltage rating of the device.

FIG. 2 shows a device that includes a superjunction type arrangement. Specifically, FIG. 2 shows a planar type power MOSFET which includes regions 28 of conductivity opposite to that of drain region 18. Regions 28 are in substantial charge balance with drain region 18 in order to form a superjunction.

In a superjunction device of a proven given breakdown voltage, it is known that Rdson per unit area is reduced as the width (Wp) of regions 28 and drain region 18 is reduced. Thus, for a device such as the one shown in FIG. 2, it is desirable to reduce the pitch (the cell to cell spacing defined by the distance between the center of adjacent gate electrodes in FIG. 2 or trenches in FIG. 1).

In the device shown by FIG. 2, regions 28 may be formed by forming multiple layers of epitaxial silicon 18'. A portion of a region 28 is then formed in each epitaxial layer by, for example, implantation followed by a diffusion drive step, before the formation of the next epitaxial layer. A final diffusion drive step can then be applied to join the separated implants in the vertical direction. Such a process is typically used to form high voltage devices because the long diffusion allows for wide (>4 um) regions 28. The wide regions 28 are not suitable for lower voltage devices and are not capable of achieving an acceptably low Rdson.

Referring to FIG. 3, regions 28 can also be formed by multiple high energy implants below channel regions 12. For example, regions 28 may be formed by a series of high energy implants through the source contact opening during the manufacturing of the device. Such a process allows for narrow, well controlled widths for regions 28 W(p) and its adjacent drain region 18 W(n) and fewer epitaxial growth steps. A device shown by FIG. 3 can exhibit a high breakdown voltage and a low Rdson.

To obtain a device according to FIG. 3, however, the high energy implants must be effectively blocked from reaching the area under the trenches that contain the gate structures. The blocking step introduces manufacturing complexities, and does not allow narrow pitch devices with a spacer-defined contact to be manufactured.

Other methods have also been suggested for forming the prior art devices. For example, it has been suggested that a region 28 in the device of FIG. 2 can be formed by etching a groove and filling the same with p-type material through, for example, epitaxial deposition. Such a process, however, involves a complicated deep trench etch process, which cannot create the narrow pitch device that is desired. The epitaxial growth process in the trench also introduces defects and can possibly compromise the reliability of the device.

Another suggested method is forming a region 28 through selective neutron transmutation doping. This process, however, is not commonly used or available for power MOSFET fabrication.

Yet another suggested method involves forming a deep trench, doping the sidewalls of the trench to form regions 28, and then filling the trench with a dielectric material. This process can possibly provide narrow pitch devices, but still requires deep trenches to be etched in the silicon, and the sidewalls to be doped in a defined manner. It is doubtful that this doping can be controlled well.

To reduce the pitch of a cell in a trench type MOSFET, Darwish in U.S. Pat. No. 6,084,264, and U.S. Publication No. 2003/0006454 suggests forming drain regions below the trenches that contain the gate structure. In the device suggested by Darwish each trench is formed in an epitaxial layer of opposite conductivity that is formed directly over a substrate of the same conductivity as the drain region. Each drain region in a device suggested by Darwish is formed by a single implant step through the bottom of a trench followed by a diffusion drive so that the implanted region can expand to reach at least the bottom of the trench and the substrate, thereby forming a drain region below the trench.

The device suggested by Darwish suffers from certain drawbacks. First, forming an epitaxial layer of the opposite conductivity directly on a substrate may limit the breakdown voltage because the depth of a drain region that can be achieved using the process proposed by Darwish may not be enough to withstand higher voltages. Furthermore, because the drain regions are formed by a single implant step followed by a diffusion drive, the width of the drain regions cannot be narrowed in a well controlled manner. In addition, because one implant step is used, the width of the trenches, through which drain implants are received, must be increased in order to allow for forming implant regions of sufficient initial width from which drain regions extending from the bottom of the trench to the substrate may be formed. Undesirably, increasing the width of the trenches results in the increase of the pitch of the cells.

It is, therefore, desirable to have a device which is not restricted by the limitations of the prior art.

SUMMARY OF THE INVENTION

A power semiconductor according to the present invention includes a trench receiving layer formed over an epitaxial layer of a first conductivity, which is formed over a semiconductor substrate of the same conductivity. A device according to the present invention further includes a plurality of trenches for containing gate structure adjacent channels regions and a drain column of the first conductivity formed below each trench, each drain column extending from the bottom of a trench to the epitaxial layer. The epitaxial layer serves as the drain region of the device.

In a device according to the present invention, each drain column is adjacent a charge-balanced region of opposite conductivity. The drain columns and the charge-balanced regions together constitute a superjunction arrangement that improves the Rdson and the breakdown voltage rating of the device.

The drain columns in a device according to the present invention are formed by multiple low dose implants of varying energy, followed by a diffusion drive. As a result, each drain column is self aligned to a corresponding trench and can have a narrow width. Therefore, the pitch of each cell in a device according to the present invention can be decreased.

The following is a list of some advantages of the present invention:

(1) A Super Junction type power MOSFET can be made with a narrower pitch than previous methods. A device according to the present invention will have a higher breakdown voltage rating and/or lower Rdson than prior art wide pitch devices based on known Super Junction physics.

(2) The width and the depth of the drain columns according to the present invention can be formed with greater precision and control due in part to the fact that the drain columns are aligned to the trenches (self-aligned) without a need for an additional photolithographic mask.

(3) The present invention is compatible with a spacer-defined contact trench structure, where no significant implant blocking layer exists at the contact layer, unlike the prior art which requires thick hard mask layers (e.g. oxide, or nitride) to prevent the penetration of dopants into selected areas during the high energy implant. Thus, devices with a small cell pitch can be manufactured. For example, a device can be manufactured that has a cell pitch of 1 um with a 0.4 um trench and 0.6 um mesa region.

(4) The epitaxial layer (drain region) in a device according to the present invention allows devices of different breakdown voltages to be made, when the depth of the drain columns is not enough to support the full voltage.

Other features and advantages of the present invention will become apparent from the following description of the invention which refers to the accompanying drawings.

DETAILED DESCRIPTION OF THE FIGURES

Figure 1:
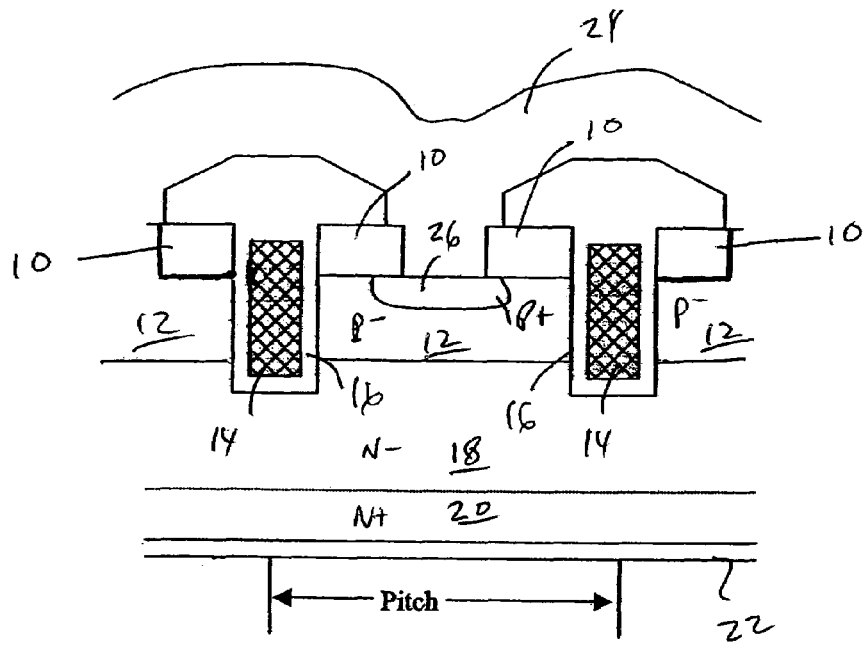
FIG. 1 shows a cross-sectional view of a portion of a trench type power semiconductor device according to prior art.
Figure 2:
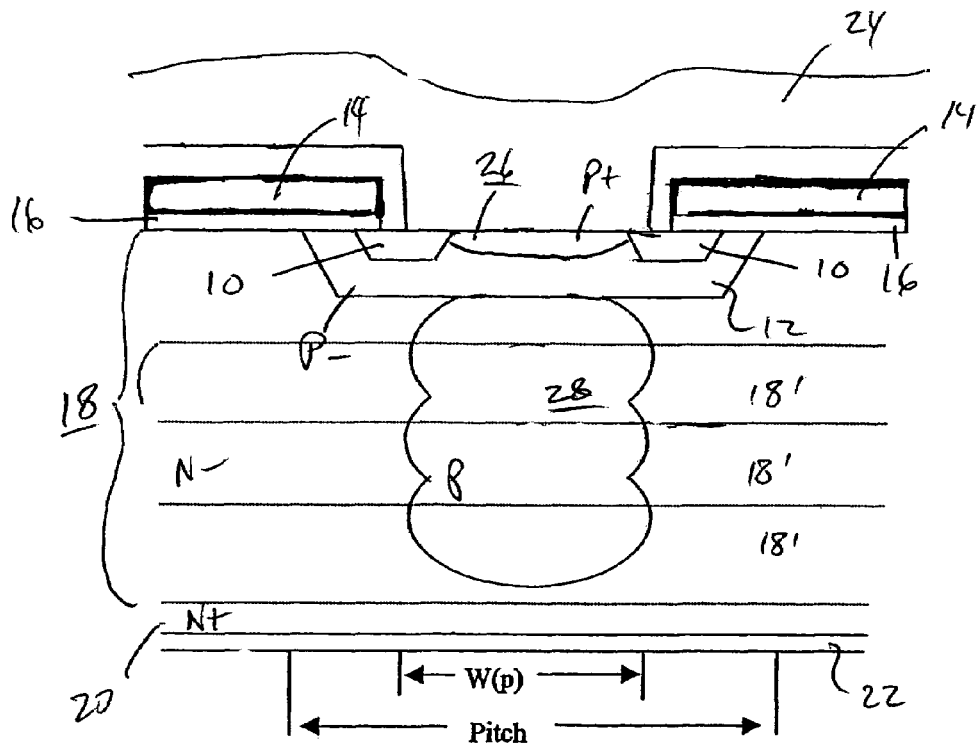
FIG. 2 shows a cross-sectional view of a portion of a planar type power semiconductor device according to prior art.
Figure 3:
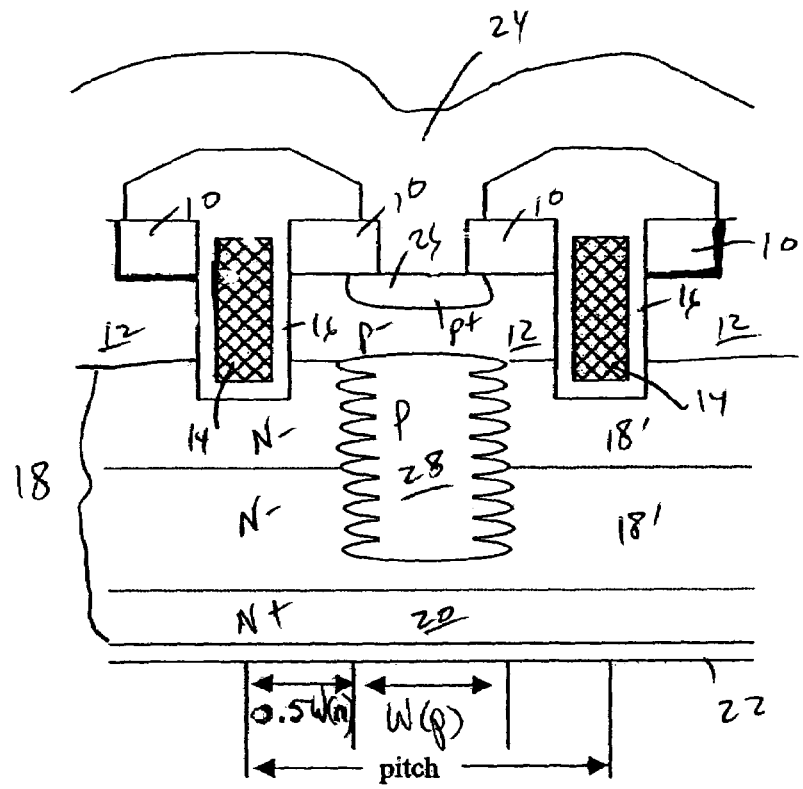
FIG. 3 shows a cross-sectional view of a portion of a trench type power semiconductor device according to prior art.
Figure 4:
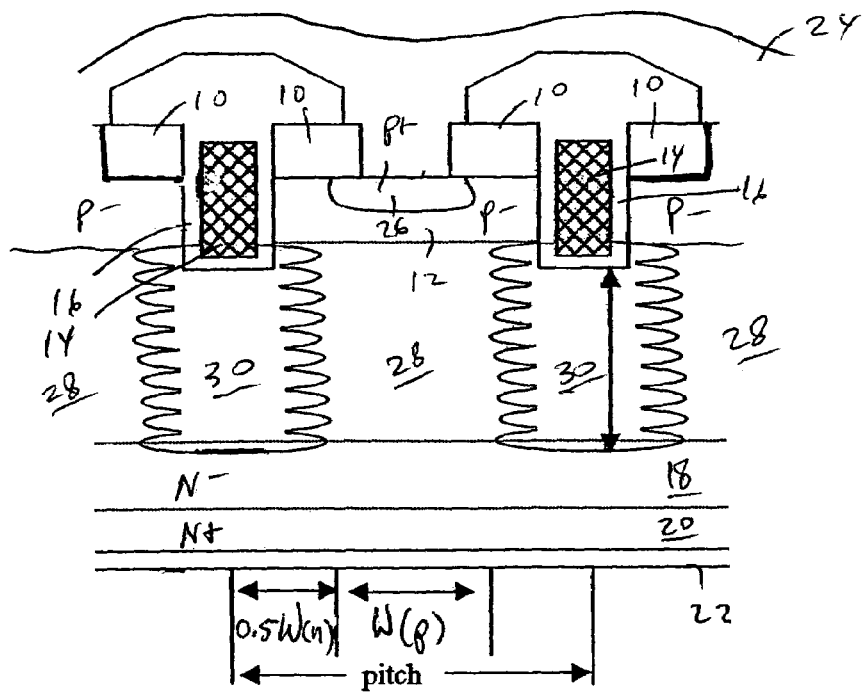
FIG. 4 shows a cross-sectional view of a portion of a trench type power semiconductor device according to one embodiment of the present invention.

Referring now to FIG. 4, a semiconductor device according to the present invention includes drain columns 30 each formed under a respective trench and extending between at least the bottom of the same to drain region 18. Drain region 18 is an epitaxially formed semiconductor layer of the same conductivity as drain columns 30, and is formed over substrate 20 of the same conductivity. Drain columns 30 are adjacent charge balanced regions 28 of opposite conductivity which extend from under channel region 12 to drain region 18. Preferably, drain columns 30 extend slightly past the bottom of each respective trench along its sidewalls and merge into channel region 12.

When an appropriate voltage is applied to the gate electrodes 14 of a device according to the present invention, channels are formed as described earlier connecting respective source regions 10 to drain columns 30, whereby current may travel from source regions 10, through respective channels to respective drain columns 30 and eventually to drain region 18.

Figure 5A:
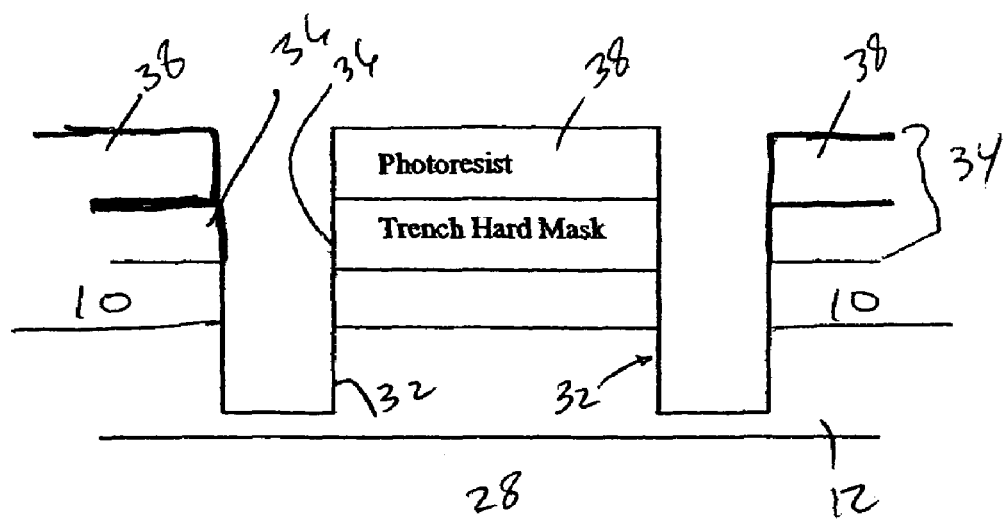
FIGS. 5A–5B illustrate the relevant processing steps for manufacturing a power semiconductor device according to the present invention.
Figure 5B:
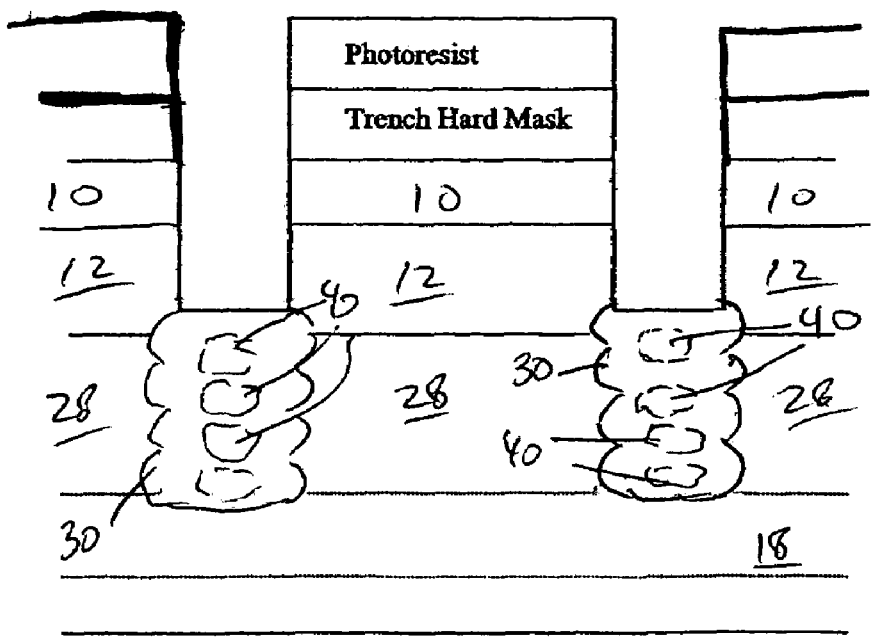

Now referring to FIGS. 5A and 5B, drain columns 30 in a device according to the present invention are formed through multiple implant steps, each implant step at a different energy level. Next, a diffusion step is applied in order to form drain columns 30.

Specifically, trenches 32 are formed in a trench receiving structure such as the one shown by FIG. 5A. A trench receiving structure includes substrate 20, and epitaxially formed semiconductor layer 18 of the same conductivity as substrate 18 formed over substrate 20, charge balance region 28 formed adjacent epitaxial layer 18, channel region 12 formed adjacent charge balance region 28, and source region 10 formed over channel region 12. Charge balance region 28, channel region 12 and source region 10 may be formed in epitaxial layer 18 through blanket implantation, or each region may be epitaxially formed. For example, charge balance region 28 may be epitaxially formed over drain region 18, and then doped to form channel region 12.

To form trenches 32 a trench mask 34 is applied to the top surface of the trench receiving structure. Trench mask 34 may include hard mask layer 36, and a photoresist layer 38. Application of hard mask 36 is preferred in that hard mask 36 prevents dopant implantation on the top surface of the trench receiving structure. Hard mask 36 is preferably thick enough to withstand the highest implant energy. A trench mask 34 without a hard mask 36 can also be used if the implants are not expected to cause damage to the trench receiving structure below the mask. Alternatively, the dopant concentration in each region can be designed to compensate for the possible penetration of dopants during implantation. Because drain columns 30 are formed in multiple implants, the dosage for each implant can be low. Thus, advantageously, the concentration of dopants that contaminate other regions of the device during implantation is low. As a result, the need for thickening the hard mask is less pressing.

Next, trenches 32 are formed in the trench receiving structure using, for example, anisotropic etching. Trenches 32 cut through source region 10, thereby creating a plurality of source regions 10 (see FIG. 4). Preferably, however, trenches 32 do not extend below channel region 12, although trenches 32 may extend into charge balance region 28.

Next, according to the present invention, dopants of opposite conductivity to channel region 12 are implanted through the bottom of each trench 32 into charge balance region 28 below. Specifically, to form drain columns 30, a sequence of implantation steps is carried out. According to the present invention, each step in the sequence is carried out at a different energy. As a result, a number of spaced drain implant regions 40 (dotted lines) are formed below each trench. The space between each drain implant region can be adjusted by adjusting the energy of each implant step. After the sequence of implantation steps is completed, a diffusion drive step is carried in order to cause the drain implant regions 40 to expand and link up to form drain columns 30 below each trench 32. Thereafter, other well known steps can be carried out to form a device according to the present invention.

The implants to form drain columns 30 can occur any time between when the trench is etched and when the trench is filled with polysilicon to form gate electrodes 14. If resist is to be used as a mask, the implant will occur immediately following etch, prior to any oxidations. If an oxide or nitride hardmask is used, the implants for drain columns 30 can occur after the sacrificial oxide has been grown, or after it has been grown and removed prior to gate oxidation. It may be beneficial to perform the implant through an oxide so the sidewalls of the trench are protected.

In an N channel device, preferably, phosphorous will be used to form drain columns 30 with energies from 10–5000 keV (5 meV). These implants must be such that, after the device is complete, an n-type column is formed from the base of the trench to the n-type epi.

It should be noted that in a preferred design an oxidation step for forming gate insulation layers 16 along the sidewalls of trenches 32 can serve as the diffusion drive step for causing the drain implant regions 40 to link up to form drain columns 30.

The multiple implantation process allows for narrow drain implant regions 40 in that each region needs only to link up with another adjacently disposed region. That is, each implant region 40 needs to only expand a short distance to link up with another region, unlike the implant region in the prior art which would need to expand the entire distance between the bottom of a trench to the substrate. Therefore, the width of trenches 32 can be minimized down to photolithographic limits. As a result, the cell pitch in a device according to the present invention can be minimized.

Furthermore, multiple implantation allows for long and narrow drain columns 30, thus allowing for devices with narrower pitch. Therefore, a process according to the present invention allows for manufacturing devices with higher breakdown voltage ratings and improved Rdson.

After these implants are performed, the normal MOSFET process flow can be resumed. The completed trench MOSFET is shown in FIG. 4. It is advantageous to have the drain columns 30 extend up from the trench bottom to at least the bottom of the polysilicon (into region 3), so that the device will have low Rdson. It may also be advantageous if the final width of each drain column 30 (Wn) is equal to the width (Wp) of each charge balance region 28.

Figure 6:
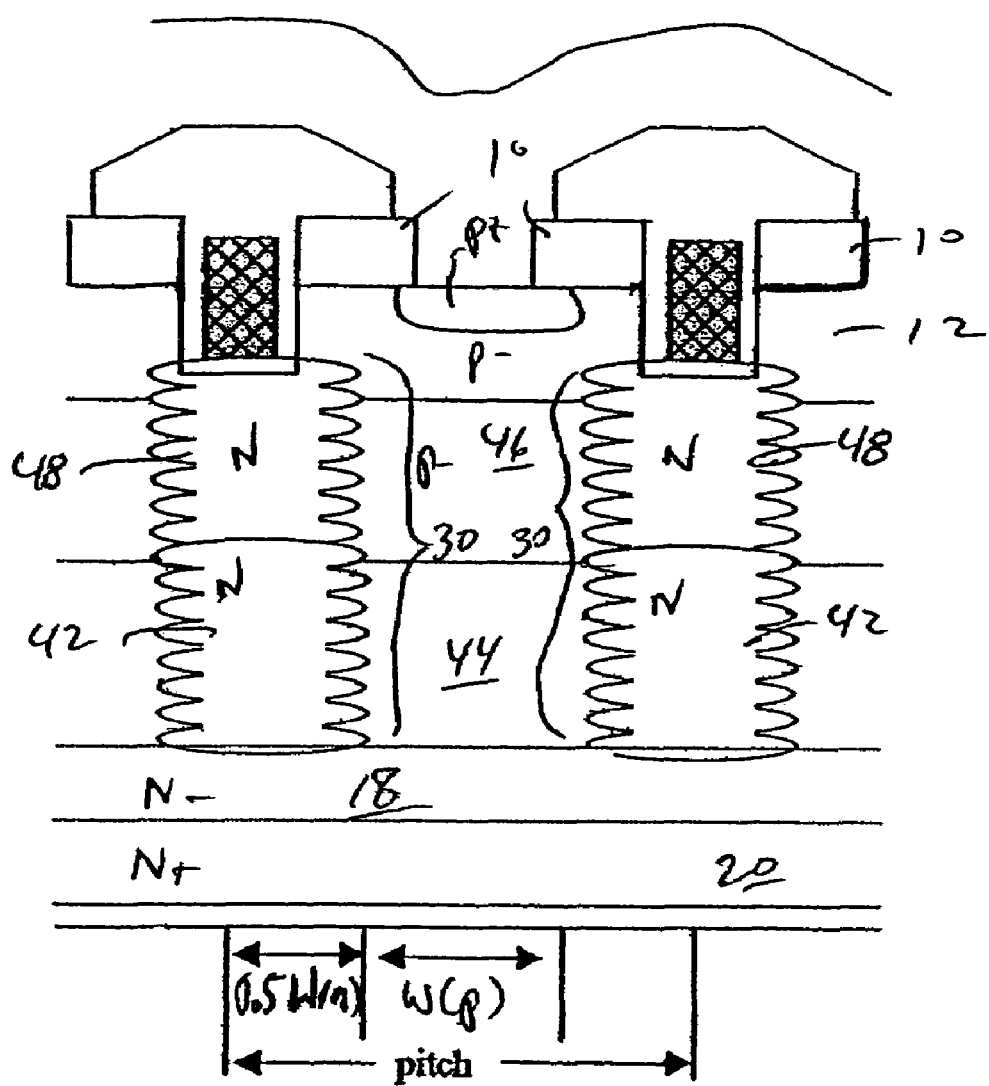
FIG. 6 shows a cross-sectional view of a portion of a power semiconductor device according to an alternative embodiment of the present invention.

FIG. 6 shows an alternative embodiment of the present invention. In the embodiment shown by FIG. 6, first a portion 42 of each drain column 30 is formed in an epitaxial layer 44. Epitaxial layer 44 is formed over drain region 18. Thereafter, a second epitaxial layer 46 is formed over epitaxial layer 44 and a process according to the present invention is followed to form a second portion 48 to complete each drain column 30. Epitaxial layers 44, 46 are doped so that they may be in charge balance with drain columns 30.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device comprising:
   a semiconductor region of first conductivity formed over a semiconductor substrate of said first conductivity;
   a semiconductor trench receiving region formed over said semiconductor region of said first conductivity;
   a plurality of trenches in said trench receiving region, each trench including a bottom surface and opposing sidewalls;
   a channel region of a second conductivity adjacent said trenches;
   a conductive column of said first conductivity directly under the bottom surface of a respective trench and reaching said semiconductor region of said first conductivity;
   a region of said second conductivity adjacent and lateral to each conductive column, said region being in charge balance with said conductive columns, and adjacent said channel region;
   conductive regions of said first conductivity adjacent each trench and in said channel region;
   a gate insulation layer on said sidewalls of said trenches;
   a gate electrode in each of said trenches; and
   an electrical contact layer over said trench receiving region and in contact with said conductive regions of said first conductivity.

2. A semiconductor device according to claim 1, wherein said semiconductor trench receiving region comprises an epitaxial layer of said second conductivity.

3. A semiconductor device according to claim 1, further comprising another electrical contact layer over said semiconductor substrate.

4. A semiconductor device according to claim 1, further comprising high conductivity contact regions of said second conductivity type in said trench receiving region in electrical contact with said electrical contact layer.

5. A semiconductor device according to claim 1, wherein each of said conductive columns extends above said bottom of a respective trench along its sidewalls.

6. A semiconductor device according to claim 1, wherein said conductive regions of said first conductivity are source regions.

7. A semiconductor device according to claim 1, wherein said semiconductor region of said first conductivity is a drain region.

8. A semiconductor device comprising:
   an epitaxially formed drain region of a first conductivity formed over a semiconductor substrate of the same conductivity;
   a trench receiving region;
   a plurality of trenches formed in said trench receiving region, each trench including a bottom surface and opposing sidewalls;
   a channel region of a second conductivity adjacent said trenches;
   source regions of a first conductivity formed in said trench receiving region adjacent said trenches;
   a plurality of columns of said first conductivity each formed under and directly below a respective trench and extending between the bottom of said trench to said drain region, each column being spaced from another column by an adjacent and laterally disposed region of said second conductivity in charge balance with said plurality of columns;
   a gate insulation layer formed at least on said sidewalls of said trenches;
   a gate electrode formed in each of said trenches; and
   a source contact layer formed over said trench receiving region and in contact with said source regions.

9. A semiconductor device according to claim 8, further comprising another electrical contact layer formed over said semiconductor substrate.

10. A semiconductor device according to claim 8, wherein said charge-balanced regions extend between said channel region and said drain region.

11. A semiconductor device according to claim 8, further comprising high conductivity contact regions of said second conductivity type formed in said trench receiving region in electrical contact with said source contact layer.

12. A semiconductor device according to claim 8, wherein said gate electrodes are comprised of conductive polysilicon.

13. A method for manufacturing a semiconductor device comprising:
    providing a trench receiving semiconductor layer of a first conductivity;
    forming a mask over said trench receiving semiconductor layer, said mask including openings, each opening terminating at said trench receiving semiconductor layer at its bottom;
    forming a trench in said trench receiving layer at said bottom of each of said openings in said mask;
    leaving said mask in place;
    sequentially implanting dopants of said second conductivity through the bottom of said trench at a plurality of different depths to form a plurality of implant regions below the bottom of said trench;
    forming a column of said second conductivity below said trench by applying a diffusion drive so that dopants at each of said plurality of implant regions diffuses to reach at least the dopants of an adjacent implant region; and
    forming regions of said first conductivity adjacent each said column of said second conductivity, said regions of said first conductivity being in charge balance with said columns of said second conductivity.

14. A method according to claim 13, wherein said trench receiving layer is formed over an epitaxial layer of said second conductivity and wherein said dopants at said plurality of said depths join up to form a column that extends between said epitaxial layer and said bottom of said trench.

15. A method according to claim 14, wherein said epitaxial layer is a drain region formed over a substrate of the same conductivity.

16. A method according to claim 13, further comprising forming a semiconductor layer below said trench receiving layer, said semiconductor layer including regions of said second conductivity and spaced columns of said first conductivity, and aligning said trenches with said columns of said first conductivity.

* * * * *

UNITED STATES PATENT AND TRADEMARK OFFICE
CERTIFICATE OF CORRECTION

PATENT NO. : 6,979,862 B2
DATED : December 27, 2005
INVENTOR(S) : Timothy Henson It is certified that error appears in the above-identified patent and that said Letters Patent is hereby corrected as shown below:

<u>Title page,</u>
Item [75], Inventors, should read -- Timothy Henson, Torrance, CA (US) --.

Signed and Sealed this

Seventh Day of March, 2006

JON W. DUDAS
*Director of the United States Patent and Trademark Office*